(12) United States Patent
Cho

(10) Patent No.: US 6,751,763 B2
(45) Date of Patent: Jun. 15, 2004

(54) SEMICONDUCTOR DEVICE TEST METHOD FOR OPTIMIZING TEST TIME

(75) Inventor: Byeong-Hwan Cho, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 394 days.

(21) Appl. No.: 10/001,462

(22) Filed: Oct. 29, 2001

(65) Prior Publication Data

US 2002/0073366 A1 Jun. 13, 2002

(30) Foreign Application Priority Data

Dec. 9, 2000 (KR) ........................................ 2000-74917

(51) Int. Cl.[7] ............................................. G11C 29/00
(52) U.S. Cl. ........................................ 714/718; 714/745
(58) Field of Search ............................... 706/1; 714/718, 714/734, 745; 369/44.35

(56) References Cited

U.S. PATENT DOCUMENTS

| 5,600,757 A | * | 2/1997 | Yamamoto et al. ............ 706/1 |
| 6,347,386 B1 | * | 2/2002 | Beffa ........................... 714/718 |
| 6,526,008 B1 | * | 2/2003 | Caponetto et al. ....... 369/44.35 |
| 6,622,270 B2 | * | 9/2003 | Beffa ........................... 714/718 |

* cited by examiner

Primary Examiner—David Ton
(74) Attorney, Agent, or Firm—Marger Johnson & McCollom, P.C.

(57) ABSTRACT

A method of testing a semiconductor device begins by reading test information into a testing apparatus. The test information is used to determine whether to perform a normal test or a fuzzy test depending on fuzzy conditions. The order of test items included in the normal test can be changed based on defect rates. And the test items to be included in the fuzzy test can be determined by selecting one or more test items from among the normal test items. The fuzzy conditions can be satisfied if the number of consecutive products that have passed the test is greater than a first value or the number of consecutive products that have failed the test is less than a second value. The test can be automatically switched between the normal test and the fuzzy test, thereby minimizing the time taken to test a semiconductor device. Also, the order of the test items can be changed so that the test begins with the test item having the highest defect rate and ends with the test item having the lowest defect rate, thereby reducing reject time. In this manner, test efficiency can be enhanced and testing expenses can be reduced.

20 Claims, 4 Drawing Sheets

SEMICONDUCTOR DEVICE TEST METHOD FOR OPTIMIZING TEST TIME

This application relies for priority upon Korean Patent Application No. 200074917, filed on Dec. 9, 2000, the contents of which are herein incorporated by reference in their entirety.

BACKGROUND OF THE INVENTION

1. Field of the Invention

The present invention relates to a semiconductor device, and more particularly, to a semiconductor device testing method that is capable of optimizing test time and enhancing test efficiency.

2. Description of Related Art

As the storage capacity of semiconductor memory devices continues to increase, development of a "system-on-chip" has begun, in which a logic circuit and a memory are combined together on one chip. In order to test the functions of a new semiconductor device having a large storage capacity or a complex structure, high-priced testing equipment or new testing programs are typically needed. New equipment or testing programs are expensive, however, and increase the cost of manufacturing semiconductor devices. One way to reduce testing expenses is to reduce the time required to develop new testing programs. Another way is to reduce the time taken to perform the testing program.

A conventional test method for a semiconductor device has fixed test items and a fixed test order, regardless of whether a semiconductor device being tested has a high defect rate or not. Thus, the conventional testing procedure will always perform all of the test items and it will therefore take a certain predetermined amount of time to complete the test. Moreover, as additional kinds of semiconductor devices are developed and as their integration density increases, the number of test items that must be performed to test the functions of these devices also increases. The required testing time is therefore expected to continue to increase.

SUMMARY OF THE INVENTION

To solve these problems, an object of the present invention is to provide a semiconductor device testing method that is capable of reducing testing costs by minimizing testing time.

According to one aspect of the present invention, a method of testing a semiconductor device includes performing a normal test and determining whether predetermined fuzzy conditions are satisfied. If the predetermined fuzzy conditions are satisfied, a fuzzy test is performed. The normal test continues to be performed, however, if the predetermined fuzzy conditions are not satisfied. The method also preferably determines whether a group of tests performed on a predetermined unit have been completed. If that group of tests has not been completed, the method returns to determining whether the predetermined fuzzy conditions are satisfied. The normal test includes a predetermined number of normal test items, while the fuzzy test preferably includes a dynamically adaptable number of fuzzy test items.

According to another aspect of the present invention, a method of testing a semiconductor device includes reading predetermined test information and using the predetermined test information to perform a normal test or a fuzzy test depending on predetermined fuzzy conditions. The order of test items in the normal test can be changed, preferably in relation to an order of defect rates. This test method can further determine which test items should be included in the fuzzy test by selecting desired test items from among the normal test items for inclusion in the fuzzy test.

BRIEF DESCRIPTION OF THE DRAWINGS

The foregoing and additional features and advantages of the present invention will become more readily apparent from the following detailed description of preferred embodiments thereof, which proceeds with reference to the attached drawings, in which.

DETAILED DESCRIPTION OF THE PREFERRED EMBODIMENTS

Figure 1:
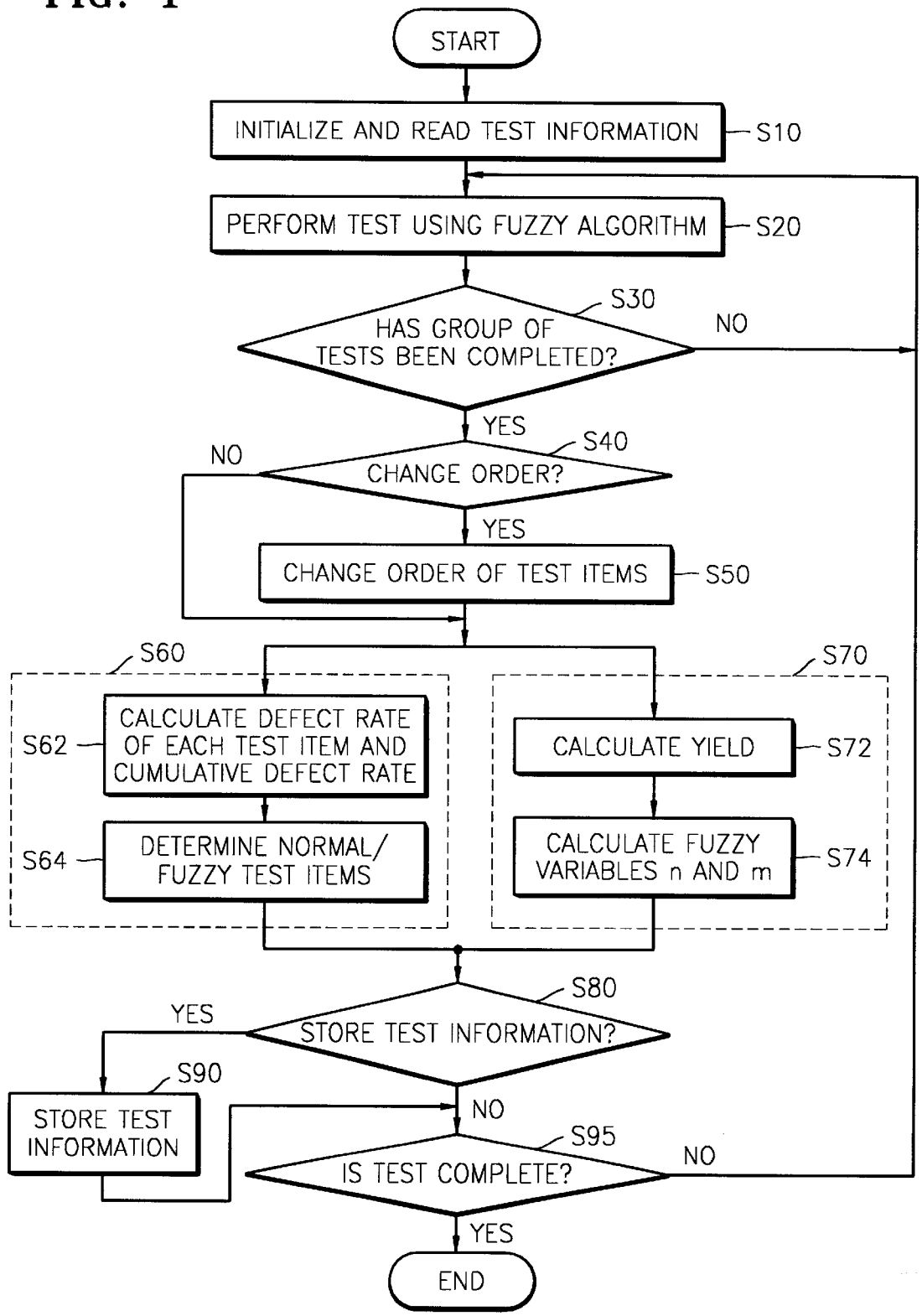
FIG. 1 is a flowchart illustrating a method of testing a semiconductor device according to an embodiment of the present invention.

Referring to FIG. 1, in an initialization step S10, before the semiconductor device test is performed, test variables are initialized and test information is read into the testing apparatus. The test information can be obtained from the results of a previous test, if any, or can be set beforehand. The test information can include the normal test items, a test order, defect rates corresponding to the normal test items, and fuzzy test items.

After the initialization step S10, a test step S20 is performed based on a fuzzy algorithm, described in further detail with reference to FIG. 2. The test step S20 determines whether the semiconductor device being tested satisfies the predetermined fuzzy conditions. If the fuzzy conditions are satisfied, a fuzzy test having predetermined fuzzy test items is performed. On the other hand, if the fuzzy conditions are not satisfied, a normal test having predetermined normal test items is performed.

After the test step S20 is performed, the testing method then determines, in a test completion check step S30, whether a predefined group of tests on a testing unit have been completed. Chips, wafers, or lots can make up the testing unit for the group of tests. If the group of tests are completed, a change order test step S40 determines whether the order of test items should be changed or not. If the group of tests have not been completed, the test step S20 is performed again. When the change order step S20 is performed after a test for a test unit (e.g., chip, wafer, or lot) has been completed, the test method can determine which unit among the various possible test units (e.g., chip, wafer, or lot) to use for the next group of tests, depending on the performance of the unit used in the previous group of tests.

If the change order test step S40 determines that the order of items in the normal test should be changed, the order of normal test items is then changed using an order changing algorithm in a change order step S50. In the change order step S50, the normal test items are rearranged sequentially according to their defect rates, from the test item with the highest defect rate to the test item with the lowest defect rate. The change order step S50 will be described in further detail later with reference to FIG. 3.

Once the change order step S50 is performed, or if the change order test step S40 determines that the order of the normal test items should not be changed, an item add/subtract step S60 is performed. In step S62 of the item add/subtract step S60, the defect rate of each of the normal test items, as well as cumulative defect rates, are calculated. Based on the results of that calculation, normal test items and fuzzy test items are determined in step S64. The add/subtract step S60 proceeds using an item add/subtract algorithm, which will be described in further detail later with reference to FIG. 4.

The yield is calculated based on the test results in a yield calculation step S72. Fuzzy variables n and m are then calculated based on the yield, during step S74. The fuzzy variables n and m are used in determining the fuzzy conditions. The fuzzy variables n and m may have a fixed value or a value dependent on the yield. The fuzzy conditions can be set, in step S70, simultaneously with the add/subtract step S60, or after completion of the add/subtract step S60.

After the item adding/subtract step S60 and the fuzzy condition setting step S70 are performed, a store test step S80 determines whether the information obtained from the previous steps should be stored or not. The test information is then selectively stored depending on the results of the store test step S80. Next, a test complete step S95 determines whether the test for a semiconductor device has ended or not. If the test has ended, all the procedures for the test are completed. If the test has not ended, the test step S20 is repeated.

Figure 2:
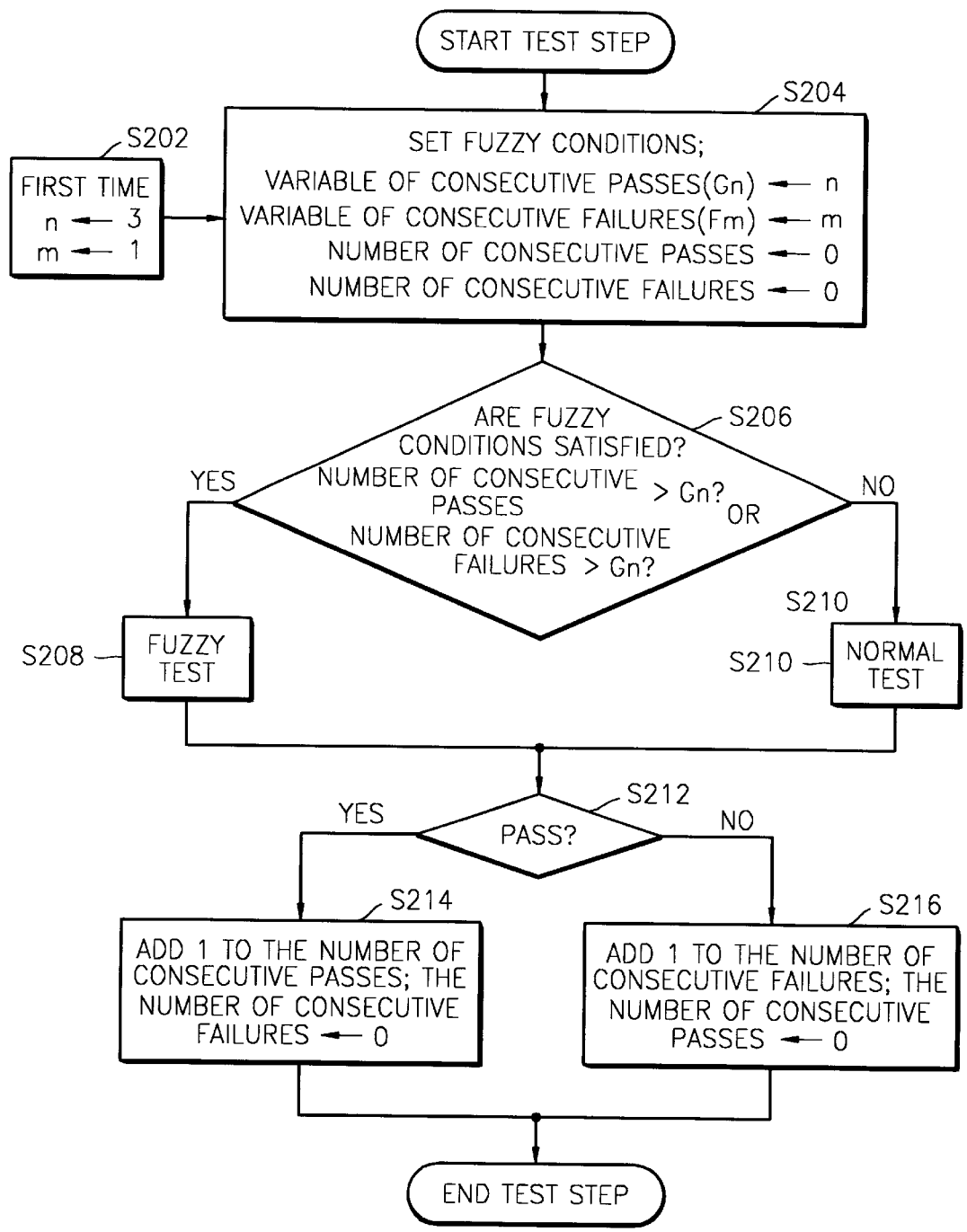
FIG. 2 is a detailed flowchart illustrating a method of testing a semiconductor device using the fuzzy algorithm of the test method shown in FIG. 1.

FIG. 2 is a detailed flowchart illustrating the test step using the fuzzy algorithm shown in FIG. 1. The fuzzy algorithm operates by using the fuzzy variables n and m (calculated by a user or determined by the yield) to determine if fuzzy conditions are satisfied. If these conditions are satisfied, a fuzzy test is performed. If the fuzzy conditions are not satisfied, a normal test is performed. The normal test includes all of the conventional test items, while the fuzzy test usually has fewer test items than the normal test. The fuzzy test may, however, have the same number of test items as the normal test.

Preferably, the fuzzy variables n and m denote the number of consecutive products that have passed the test and the number of consecutive products that have failed the test, respectively. These values are fuzzy factors which are defined so as to fit the characteristics of a product to be tested. In addition, as described above, they may vary depending on the yield. In the test shown in FIG. 2, variables Gn and Fm are used for storing the fuzzy variables n and m at the beginning of a test step. The variables Gn and Fm are used to define the number of consecutive passes and the number of consecutive failures, respectively, for satisfying fuzzy conditions.

Referring to FIG. 2, when the test step S20 begins, the fuzzy conditions are set during the set conditions step S204. More particularly, in the set conditions step S204, the fuzzy data n and m are inputted into to the number of consecutive passes variable Gn and the number of consecutive failures variable Fm, respectively. Because it takes a certain predetermined amount of time to calculate the fuzzy variables depending on the yield, when the test is performed for the first time, the fuzzy variables are set to arbitrary values. In the present embodiment, n and m are preset to "3" and "1", respectively, during step S202. After transferring the data from variables n and m into the variables Gn and Fm, respectively, the consecutive numbers of good products n and inferior products m, which vary depending on the results of an actual test, are then initialized to "0".

A fuzzy conditions test step S206 then determines whether the fuzzy conditions are satisfied or not. If the number of consecutive passes n is more than the variable Gn, or the number of consecutive failures m is less than the variable Fm, the fuzzy conditions are satisfied. If the fuzzy conditions are satisfied, the fuzzy test is performed in step S208. If the fuzzy conditions are not satisfied, the normal test is performed in step S210. After the fuzzy test or the normal test is performed, a pass test step S212 determines whether the tested product passed or failed the selected test. If the product passed, "1" is added to the number of consecutive passes n and the number of consecutive failures m is initialized to "0" during step S214. If the product fails, "1" is added to the number of consecutive failures m and the number of consecutive passes n is initialized to "0" during step S216.

It is preferable that the normal test is performed at the early stages. If a number of products equal to or greater than Fm are consecutively determined to be failures, the normal test continues to be performed. If a number of products equal to or greater than Gn are consecutively determined to be passes, however, the fuzzy test is performed instead. In other words, the test method automatically switches back and forth between a normal test mode and a fuzzy test mode depending on the results of the tests. After the test step S20 is performed, the order of test items can be changed based on the results of the tests performed in terms of a test unit (e.g., a chip, a wafer, or a lot). The unit for a group of tests can be automatically determined or determined by a user.

Figure 3:
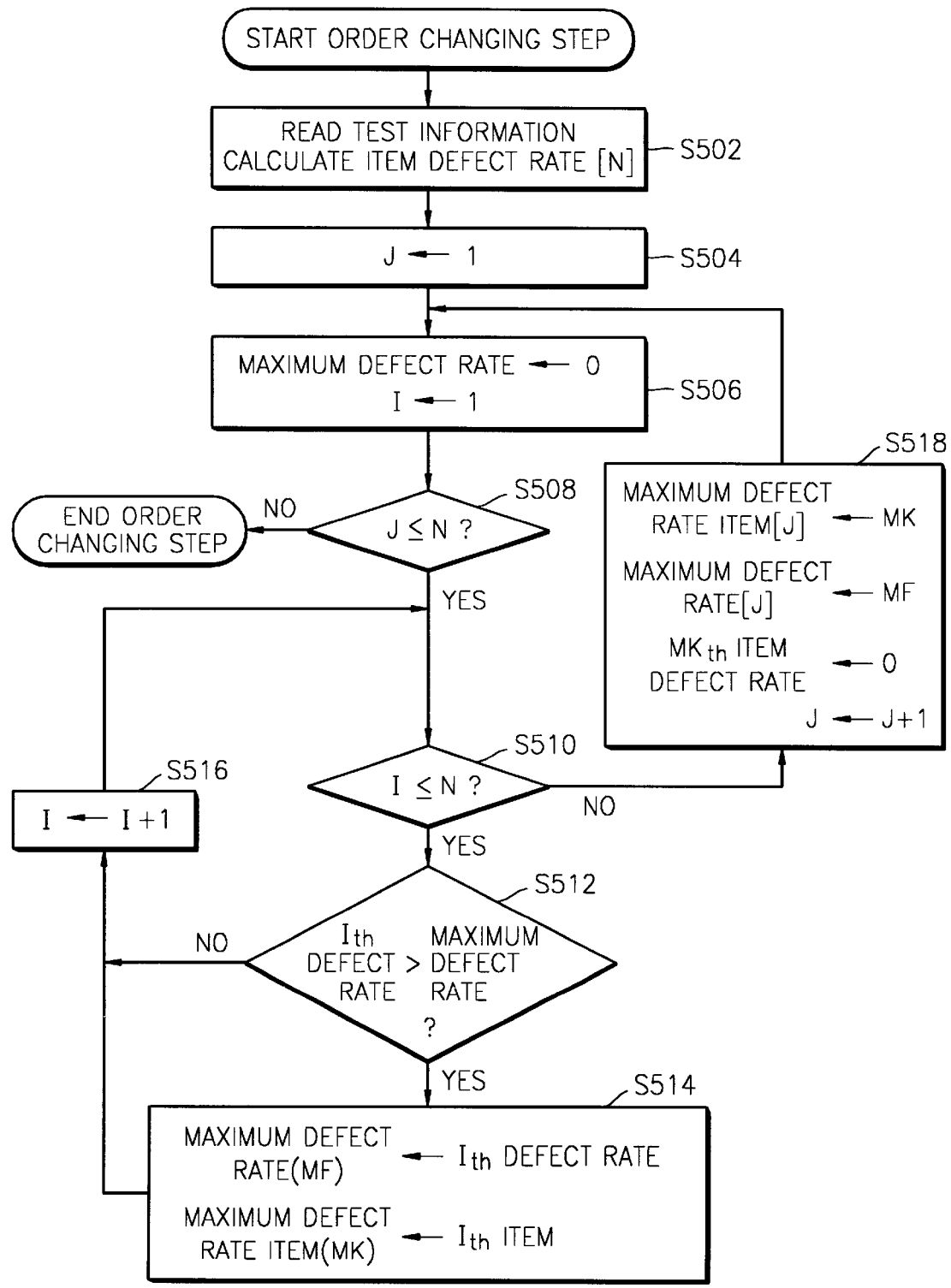
FIG. 3 is a detailed flowchart illustrating a method of changing the order of test items of the normal test in the test method shown in FIG. 1.

FIG. 3 is a detailed flowchart illustrating the test order change step S50 of the test method shown in FIG. 1. The test order change step S50 proceeds using an order changing algorithm that reduces reject time. The order changing algorithm sets the sequential order of the test items to proceed from the test item having the highest defect rate to the test item having the lowest defect rate. After the test order has been changed, the normal test for a semiconductor device begins with the test item having the highest defect rate and ends with the test item having the lowest defect rate.

Referring to FIG. 3, during the order changing step S50, the defect rates of each of the test items is calculated using the test information obtained in step S502. The number of test items is represented by a positive integer N. Accordingly, there are N defect rates of the N test items ranging from the first to the Nth. The normal test items are the same as the complete test items.

Next, a variable J is initialized to "1" in step S504. The variable J is used for displaying the first through the Nth test items. The maximum defect rate MF is initialized to "0" and a variable I is initialized to "1" in step S506. After the step S506 is performed, it is determined whether the variable J is less than or equal to N in step S508. If J is less than or equal to N, it is determined whether the variable I is less than or equal to N in step S510. If the variable I is less than or equal to N, it is determined whether the Ith defect rate is greater than the maximum defect rate MF in step S512. If the Ith defect rate is greater than the maximum defect rate MF, the Ith defect rate is stored as the maximum defect rate MF in step S514 and the Ith test item is stored as the test item having the maximum defect rate MK in step S514. In the step S512, if the Ith defect rate is not greater than the maximum defect rate MF, or the step S514 has already been performed, "1" is added to the variable I in step S516 and then, the steps S510 through S516 are repeated. In this way, the test item MK having the maximum defect rate and the maximum defect rate MF can be obtained.

In the step S510, after N number of test items have been evaluated, the test item MK having the maximum defect rate is stored as the first test item, having the maximum defect rate, and the maximum defect rate MF is stored as the first maximum defect rate. The defect rate of the MKth test item is then initialized to "0" and "1" is added to the variable J. The step S506 is then repeated. When J is "2", for instance, the steps S510 through S516 are repeated and the second test item, having the second maximum defect rate, and the second maximum defect rate are obtained. The process is repeated until the N test items have been arranged ranging from the first test item having the maximum defect rate to the Nth test item having the lowest defect rate. Accordingly, the order change step S50 is used to arrange the test for a semiconductor device to begin with the test item in which defects occur most frequently. In this manner, reject time can be minimized.

Figure 4:
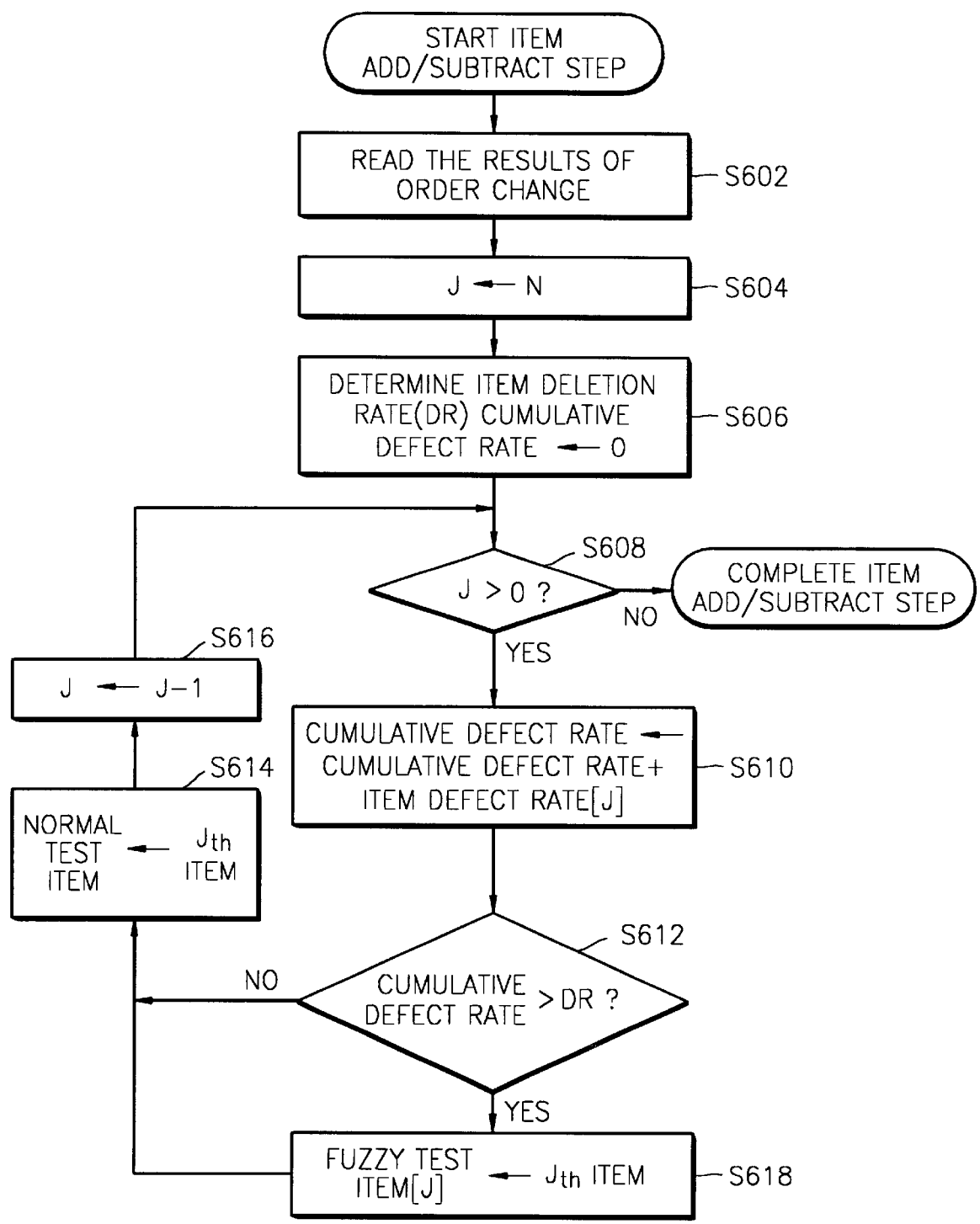
FIG. 4 is a detailed flowchart illustrating a method of adding/subtracting test items from the fuzzy algorithm of the test method shown in FIG. 1.

FIG. 4 is a detailed flowchart illustrating the item adding/subtracting step S60 shown in FIG. 1. The item add/subtract step S60 uses an item add/subtract algorithm to select the normal test items that identify the greatest number of defects and to use those test items as fuzzy test items. The test items are preferably rearranged sequentially from the test item with the highest defect rate through the test item with the lowest defect rate during the order change step S50.

Referring to FIG. 4, when the item adding/subtracting step S60 begins, the test items from step S50, which have been sequentially arranged from the test item with the highest defect rate to the test item with the lowest defect rate, are read in step S602. After the step S602, the variable J is initialized to "N" in step S604, where N indicates the total number of the test items. Next, an item deletion rate DR is set by a user and then, a cumulative defect rate is initialized to "0" in step S606. Preferably, the item deletion rate DR is a cumulative defect rate in which all of the defect rates (from the test items having a relatively low defect rate through the test items having a relatively high defect rate) are accumulated.

Next, it is determined if the variable J is greater than "0" in step S608. As long as J is greater than "0", the defect rate of the Jth test item is added to the cumulative defect rate and the resultant defect rate is stored as a new cumulative defect rate in step S610. If the new cumulative defect rate is less than the item deletion rate or the same as the item deletion rate, the Jth test item is set as a Jth normal test item in step S614 and then, the variable J is reduced by "1" in step S616. The step S608 is performed again. When the renewed cumulative defect rate is less than or equal to the item deletion rate, the Jth test item is not selected as a fuzzy test item.

If the renewed cumulative defect rate is greater than the item deletion rate, however, the Jth test item becomes the Jth normal test item in step S614 and a Jth fuzzy test item in step S618. In other words, the Jth test item can be both a normal test item and a fuzzy test item. Next, the variable J is reduced by "1" in step S616 and the step S608 is performed again. If the variable J is equal to "0" in the step S608, the item add/subtract step S60 is completed.

As described above, in the item adding/subtracting step S60, the defect rates for test items ranging from the minimum to a particular value of a defect rate are sequentially accumulated. Then, if the cumulative defect rate of a test item is less than an item deletion rate, that test item is excluded from fuzzy test items. The fuzzy test items therefore consist of several normal test items that show a relatively high defect rate. In the present embodiment, the fuzzy test items are determined using a cumulative defect rate of each normal test item. However, a defect rate for each of the test items may be used in determining the fuzzy test items. For example, if a test item has a defect rate that is less than a predetermined value, the test item can be excluded from the fuzzy test items. Using this alternate method, the fuzzy test items may consist of only the test items having a defect rate greater than the predetermined value.

According a preferred embodiment of the invention, the semiconductor device test method can be automatically switched between a normal test mode and a fuzzy test mode depending on predetermined conditions, thereby reducing the time taken to perform the test. Also, the test method can rearrange the order of its original test items such that the test items are performed sequentially from the test item having the highest defect rate to the test item having the lowest defect rate. In this manner, the reject time can be reduced and testing time can thereby also be reduced. Test efficiency can therefore be enhanced while lowering testing costs.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of testing a semiconductor device, said method comprising:

determining whether fuzzy conditions are satisfied;

performing a fuzzy test comprising a plurality of fuzzy test items if the predetermined fuzzy conditions are satisfied;

performing a normal test comprising a plurality of normal test items if the fuzzy conditions are not satisfied;

determining whether a group of tests have been completed; and returning to determining whether the fuzzy conditions are satisfied if the group of tests has not been completed.

2. A method of testing a semiconductor device according to claim 1, wherein if the group of test items has been completed, the method further comprises:

determining whether an order of the normal test items should be changed; and changing the order of the normal test items based on a defect rate of each of the normal test items, if it is determined that the order of the normal test items should be changed.

3. A method of testing a semiconductor device according to claim 1, wherein, if the group of tests has been completed, the method further comprises selecting the fuzzy test items from among the normal test items depending on a defect rate of each of the normal test items.

4. A method of testing a semiconductor device according to claim 3, further comprising selecting the normal test items with defect rates higher than a predetermined value to be the fuzzy test items.

5. A method of testing a semiconductor device according to claim 3, further comprising:

sequentially determining a first item defect rate through an Nth item defect rate, wherein N is an integer greater than one, and wherein the first item defect rate corresponds to a highest defect rate of the normal test items and wherein the Nth item defect rate corresponds to a lowest defect rate of the normal test items;

determining an item deletion rate;

calculating a first cumulative defect rate through an Nth cumulative defect rate, wherein the first cumulative defect rate is a summation of the first through the Nth item defect rates and wherein the Nth cumulative defect rate is equal to the Nth item defect rate; and selecting the normal test items corresponding to the first item defect rate through the (I−1)th item defect rate as the fuzzy test items, where I is an integer between 1 and N, and wherein an Ith cumulative defect rate is less than or equal to the item deletion rate and an (I−1)th cumulative defect rate is greater than the item deletion rate.

6. A method of testing a semiconductor device according to claim 1, wherein the group of tests is performed in terms of a unit, and wherein said unit comprises one of a chip unit, a wafer unit, or a lot unit.

7. A method of testing a semiconductor device, said method comprising:

reading test information comprising fuzzy conditions into a test apparatus;

performing a normal test comprising a plurality of normal test items or a fuzzy test comprising one or more fuzzy test items, depending on whether or not the fuzzy conditions are satisfied;

determining whether to change an order of normal test items;

changing the order of normal test items, if it is determined that the order of normal test items should be changed; and selecting one or more normal test items from the normal test to be included in the fuzzy test as fuzzy test items.

8. A method of testing a semiconductor device according to claim 7, wherein the fuzzy conditions are satisfied if a number of consecutive products that have passed the test is greater than a first value or if a number of consecutive products that have failed the test is less than a second value.

9. A method of testing a semiconductor device according to claim 7, further comprising:

determining whether the fuzzy conditions have been satisfied;

performing the fuzzy test if the fuzzy conditions have been satisfied;

performing the normal test if the fuzzy conditions have not been satisfied;

determining whether a product being tested has passed the performed test;

adding one to the consecutive number of good products and initializing the consecutive number of inferior products to zero if the product is determined to have passed the test; and adding one to the consecutive number of inferior products and initializing the consecutive number of good products to zero if the product is determined to have failed the test.

10. A method of testing a semiconductor device according to claim 7, further comprising:

calculating an item defect rate of each of the normal test items; and arranging the order of normal test items sequentially from the normal test item having a first item defect rate to the test item having an Nth item defect rate, where N equals a number of normal test items, wherein the first item defect rate corresponds to a highest item defect rate, and wherein the Nth item defect rate corresponds to the lowest item defect rate.

11. A method of testing a semiconductor device according to claim 10, further comprising:

determining an item deletion rate;

calculating a first cumulative defect rate through an Nth cumulative defect rate, wherein the Nth cumulative defect rate is equal to the Nth item defect rate, and wherein the first cumulative defect rate is equal to the sum of the first through the Nth item defect rates; and selecting normal test items corresponding to the first through an (I−1)th item defect rate to become fuzzy test items, wherein the (I−1)th cumulative defect rate is greater than the item deletion rate, wherein the Ith cumulative defect rate is less than or equal to the item deletion rate, and where I is an integer between 1 and N.

12. A method according to claim 7, further comprising:

calculating a yield; and calculating a fuzzy variable corresponding to a number of consecutive devices that have passed the test.

13. A method according to claim 12, further comprising calculating another fuzzy variable corresponding to a number of consecutive devices that have failed the test.

14. A method according to claim 7, further comprising:

calculating test information based on results of the tests; and selectively storing the test information for use in future tests.

15. A method of testing a semiconductor device, said method comprising:

initializing test variables;

reading test information into a testing apparatus;

using a fuzzy algorithm to determine whether to apply a normal test comprising a plurality of normal test items or a fuzzy test comprising a plurality of fuzzy test items; and applying an appropriate test based on the fuzzy algorithm;

determining whether to change an order of test items of the appropriate test; and changing the order of test items of the appropriate test, if it is determined that the order of test items should be changed.

16. A method according to claim 15, further comprising repeatedly determining which test is appropriate and applying the appropriate test until a group of tests have been completed.

17. A method according to claim 16, further comprising selecting a test unit for performing the group of tests based on the performance of a previous test unit.

18. A method according to claim 15, wherein changing the order of test items of the appropriate test comprises:

calculating a defect rate of each test item of the appropriate test; and rearranging the test items of the appropriate test such that the test item corresponding to a highest defect rate is performed first, followed by the test item having the next highest defect rate, and so forth.

19. A method according to claim 15, further comprising:

calculating a yield;

calculating a fuzzy variable based on a number of consecutive passes; and calculating a fuzzy variable based on a number of consecutive failures.

20. A method according to claim 15, further comprising:

calculating cumulative defect rates for each of the normal test items of the normal test; and selecting normal test items from the normal test for inclusion as fuzzy test items in the fuzzy test based on the cumulative defect rates.

* * * * *